(12) United States Patent
Farrar

(10) Patent No.: US 7,465,608 B1
(45) Date of Patent: *Dec. 16, 2008

(54) THREE-DIMENSIONAL MULTICHIP MODULE

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/920,022

(22) Filed: Aug. 17, 2004

Related U.S. Application Data

(63) Continuation of application No. 10/178,183, filed on Jun. 21, 2002, now Pat. No. 6,790,702.

(51) Int. Cl.
*H01L 21/44* (2006.01)
(52) U.S. Cl. ..................... 438/107
(58) Field of Classification Search ............... 257/686, 257/777, 724, E21.002; 438/107–109
See application file for complete search history.

(56) References Cited

U.S. PATENT DOCUMENTS

| | | |
|---|---|---|
| 3,247,446 A | 4/1966 | Krsek |
| 3,548,915 A | 12/1970 | Reading et al. |
| 3,548,948 A | 12/1970 | Reading et al. |
| 3,687,737 A | 8/1972 | Krock et al. |
| 4,138,692 A | 2/1979 | Meeker et al. |
| 4,389,429 A | 6/1983 | Soclof |
| 4,403,238 A | 9/1983 | Clark |
| 4,525,921 A | 7/1985 | Carson et al. |
| 4,561,173 A | 12/1985 | Te Velde |
| 4,617,160 A | 10/1986 | Belanger et al. |
| 4,706,166 A | 11/1987 | Go |
| 4,754,316 A | 6/1988 | Reid |
| 4,868,712 A | 9/1989 | Woodman |
| 4,962,058 A | 10/1990 | Cronin et al. |
| 4,963,976 A | 10/1990 | Fluegel et al. |
| 5,158,986 A | 10/1992 | Cha et al. |
| 5,198,889 A | 3/1993 | Hisano et al. |
| 5,202,754 A | 4/1993 | Bertin et al. |
| 5,218,515 A | 6/1993 | Bernhardt |
| 5,235,672 A | 8/1993 | Carson |

(Continued)

FOREIGN PATENT DOCUMENTS

EP   0 315 792 A2   10/1988

OTHER PUBLICATIONS

"The New Low-k Candidate: It's A Gas"; Semiconductor International; Mar. 1999, p. 38.

(Continued)

*Primary Examiner*—Nathan W Ha
(74) *Attorney, Agent, or Firm*—Knobbe, Martens, Olson & Bear LLP

(57) ABSTRACT

A three-dimensional multichip module having a base structure formed by a plurality of chips secured together in a stack and a plurality of exterior chips mounted to the exterior faces of the base structure. The multichip module may incorporate memory chips, processor chips, logic chips, A to D converter chips, and other chips in a compact package. The module permits chips that require extensive cooling to be positioned within the structure in a manner such that a large surface area of the chip is not in contact with other chips. The module also permits extensive interconnection between chips within the module.

15 Claims, 5 Drawing Sheets

U.S. PATENT DOCUMENTS

| | | | |
|---|---|---|---|
| 5,241,450 A | 8/1993 | Bernhardt et al. | |
| 5,270,261 A | 12/1993 | Bertin et al. | |
| 5,270,572 A | 12/1993 | Nakajima et al. | |
| 5,296,741 A | 3/1994 | Kim | |
| 5,324,683 A | 6/1994 | Fitch et al. | |
| 5,324,684 A | 6/1994 | Kermani et al. | |
| 5,334,356 A | 8/1994 | Baldwin et al. | |
| 5,336,914 A | 8/1994 | Andoh | |
| 5,347,428 A | 9/1994 | Carson et al. | |
| 5,405,808 A | 4/1995 | Rostoker et al. | |
| 5,408,742 A | 4/1995 | Zaidel et al. | |
| 5,444,105 A | 8/1995 | Ornstein | |
| 5,457,334 A | 10/1995 | Nishimoto | |
| 5,478,781 A | 12/1995 | Bertin et al. | |
| 5,506,753 A | 4/1996 | Bertin et al. | |
| 5,509,468 A | 4/1996 | Lopez | |
| 5,510,645 A | 4/1996 | Fitch et al. | |
| 5,561,593 A * | 10/1996 | Rotolante | 361/735 |
| 5,578,146 A | 11/1996 | Grant et al. | |
| 5,581,498 A | 12/1996 | Ludwig et al. | |
| 5,593,926 A | 1/1997 | Fujihira | |
| 5,652,462 A | 7/1997 | Matsunaga et al. | |
| 5,719,438 A * | 2/1998 | Beilstein et al. | 257/686 |
| 5,719,444 A | 2/1998 | Tilton et al. | |
| 5,737,192 A | 4/1998 | Linderman | |
| 5,754,405 A | 5/1998 | Derouiche | |
| 5,763,943 A * | 6/1998 | Baker et al. | 257/686 |
| 5,807,791 A | 9/1998 | Bertin et al. | |
| 5,891,797 A | 4/1999 | Farrar | |
| 5,898,220 A | 4/1999 | Ball | |
| 5,907,178 A | 5/1999 | Baker et al. | |
| 5,910,682 A * | 6/1999 | Song | 257/685 |
| 5,936,840 A | 8/1999 | Satwinder | |
| 5,994,777 A | 11/1999 | Farrar | |
| 6,008,530 A | 12/1999 | Kano | |
| 6,014,313 A | 1/2000 | Hesselbom | |
| 6,018,616 A | 1/2000 | Schaper | |
| 6,025,642 A | 2/2000 | Burns | |
| 6,077,792 A | 6/2000 | Farrar | |
| 6,115,242 A | 9/2000 | Lambrecht | |
| RE36,916 E | 10/2000 | Moshayedi | |
| 6,133,626 A * | 10/2000 | Hawke et al. | 257/686 |
| 6,134,892 A | 10/2000 | Turner et al. | |
| 6,169,325 B1 | 1/2001 | Azuma et al. | |
| 6,222,737 B1 | 4/2001 | Ross | |
| D459,317 S | 6/2002 | Fukumoto et al. | |
| 6,410,859 B1 * | 6/2002 | King | 174/260 |
| 6,433,413 B1 | 8/2002 | Farrar | |
| 6,489,687 B1 | 12/2002 | Hashimoto | |
| 6,506,981 B1 | 1/2003 | Liberkowski | |
| 6,686,654 B2 | 2/2004 | Farrar et al. | |
| 6,747,347 B2 | 6/2004 | Farrar et al. | |
| 6,790,702 B2 | 9/2004 | Farrar | |
| 6,822,340 B2 * | 11/2004 | Lamson et al. | 257/790 |
| 6,861,287 B2 | 3/2005 | Farrar | |
| 2002/0053728 A1 | 5/2002 | Isaak et al. | |
| 2002/0074637 A1 | 6/2002 | McFarland | |
| 2002/0079568 A1 | 6/2002 | Degani et al. | |
| 2003/0015781 A1 * | 1/2003 | Farrar | 257/686 |
| 2003/0020153 A1 | 1/2003 | Bruce et al. | |
| 2004/0207096 A1 * | 10/2004 | Lamson et al. | 257/790 |

OTHER PUBLICATIONS

E. Jan-Vardaman; "Future Packaging Trends: CSP vs. Flip Chip"; Proceedings of the 11th European Microelectronics Conference; 1997; pp. 295-299.

A.J. Blodgett and D.R. Barbour; "Thermal Conduction Module: A High-Performance Multilayer Ceramic Package"; IBM Journal of Research and Development, vol. 26, No. 1; Jan. 1982; pp. 30-36.

* cited by examiner

THREE-DIMENSIONAL MULTICHIP MODULE

RELATED APPLICATIONS

This application is a continuation application of U.S. patent application Ser. No. 10/178,183 filed Jun. 21, 2002 now U.S. Pat. No. 6,790,702 entitled "A THREE-DIMENSIONAL MULTICHIP MODULE", which claims priority to U.S. Pat. No. 6,433,413 filed Aug. 17, 2001, each is hereby incorporated by reference in its entirety.

BACKGROUND OF THE INVENTION

1. Field of the Invention

This invention relates to high density electronic packaging modules, and more particularly, to a three-dimensional multichip module comprised of memory and processor chips packaged in a single compact structure.

2. Description of the Related Art

To provide improved performance, manufacturers of integrated circuit chips continually strive to increase packaging density, which has led to the development of high density electronic packaging modules such as three-dimensional multichip structures. These multichip structures typically include a plurality of semiconductor chips that are adhered together in a stack so as to reduce the amount of space the chips occupy inside a system. It is generally understood that each chip in the stack has conductive leads that extend to one edge of the chip to provide electrical contact with external circuitry. Typically, a metallization pattern is provided on one side of the stack to establish electrical connection to circuitry external to the stack.

Disadvantageously, these multichip structures may not be suitable for IC chips that generate excessive heat during operation because it is difficult for heat to dissipate when the chips are sandwiched in a stack with other chips. Moreover, chips that generate excessive heat can transfer heat to adjacent chips in the stack and cause the adjacent chips to also overheat. Furthermore, the conventional multichip structures have limited space available on the side of the structure for interconnection wiring. As such, these structures may also not be suitable for chips that require numerous electrical connections to other chips in the same stack.

Thus, most conventional multichip modules are typically comprised of chips that perform essentially the same function because "same function" chips generally do not require extensive interconnection with each other. For instance, the memory chips of a system are often incorporated into multichip structures because memory chips do not have to be extensively interconnected with each other. Furthermore, memory chips also tend not to generate excessive heat and are thus suitable for stack configuration.

Conversely, non-memory chips such as processor chips, logic chips, and A to D converter chips are usually not included as part of a multichip module because these chips generate higher heat per unit area and can be difficult to cool when sandwiched in a stack with other chips. In addition to cooling problems, processor chips, in particular, often require extensive interconnection with other chips in the module. In some instances, there is insufficient space on the multichip structure to accommodate all the necessary conductive leads required to interconnect the processor chips to various other chips in the module. Although through chip connections have been proposed to make inter-chip connections, see for example, U.S. Pat. No. 5,270,261, the process of forming these connections adds to the cost and complexity of fabrication. In light of the foregoing disadvantages, processor chips and many other non-memory chips are typically not incorporated in conventional multichip modules.

However, as computerized instruments continue to decrease in size, it becomes more desirable to combine chips of an entire system, including memory, processor and logic chips into one compact structure. Hence, it will be appreciated that there is a need for a multichip structure that comprises chips of an entire system and can be installed into and removed from the system as a unit. To this end, there is a particular need for a multichip structure that combines memory and non-memory chips in the same structure in a manner such that these chips are conveniently interconnected with each other and there is adequate cooling for chips that generate large heat per unit area.

SUMMARY OF THE INVENTION

The aforementioned needs are satisfied by the device and process of the present invention which are directed to a multichip module that includes both memory and non-memory chips. In one aspect, the multichip module comprises a plurality of semiconductor chips that are stacked and secured together in a manner so as to form a base structure having a first lateral face that is comprised of a portion of each chip. An exterior chip is mounted to the base structure in a manner such that a first surface of the exterior chip is positioned adjacent the first lateral face and extends across at least a portion of the first lateral face.

In another embodiment, the first lateral face of the base structure further comprises a plurality of conductive contacts that are interconnected to circuits in at least some of the chips forming the base structure. The conductive contacts may comprise conductor ends that are configured to make contact with exposed conductive elements formed on the first surface of the exterior chip when the exterior chip is mounted to the base structure.

Preferably, the base structure of the multichip module has four lateral faces wherein each lateral face is comprised of a portion of each chip in the base structure. Furthermore, a plurality of exterior chips are mounted to three of the lateral faces in a manner such that a first surface of each exterior chip is positioned adjacent the respective lateral face and extends across at least a portion of the lateral face. The exterior chips can make electrical contact with the chips in the base structure via conductive contacts formed on the lateral faces. The exterior chips can also be connected to each other via wire bonding or other interconnection techniques.

In yet another embodiment, the base structure of the multichip module further comprises an upper face and a lower face wherein a fourth and a fifth exterior chip are mounted respectively to the upper and lower faces. Preferably, the chips are stacked in a manner such that the upper and lower faces of the base structure are formed by circuit containing, active surfaces of the chips located at the upper and lower ends of the base structure. In one embodiment, the chip located at the upper end of the structure is stacked back to back against the adjacent chip so that the active surface of the chip at the upper end forms the upper face of the structure while the chip at the lower end forms the lower surface of the structure. Furthermore, conductive elements formed on the fourth and fifth exterior chips are positioned adjacent at least some of the conductors on the upper and lower faces respectively so as to establish electrical interconnection.

Furthermore, the multichip module may also comprise an insulating material that is formed between a first surface of the fourth exterior chip and the upper face of the base structure. An insulating material can also be formed between a first surface of the fifth exterior chip and the lower face of the base structure. Preferably, the insulating layers comprise a foamed polymeric material having a plurality of enclosed regions of air that is less than the minimum distance separating adjacent conductors on the upper and lower faces of the base structure. The foamed polymeric material can also be treated so as to provide the material with hydrophilic properties. Preferably, the chips in the base structure perform substantially the same function. Preferably, the exterior chips of the multichip module comprises non-memory chips, such as processor chip, logic chips, or A to D converter chip. In one embodiment, the exterior chips can be interconnected to each other via edge C4 connections.

In another aspect, the invention is directed to a method of forming a multichip module. The method comprises securing together a plurality of semiconductor chips in a manner so as to form a base structure having at least one lateral face that is comprised of a portion of each chip. The method further includes forming a plurality of conductive contacts on the at least one lateral face wherein the conductive contacts provide connection between the chips and external circuitry. The method also includes securing an exterior chip to the at least one lateral face wherein the exterior chip extends across at least a portion of the lateral face.

In yet another aspect, the multichip module comprises memory and non-memory chips which, in combination, are sufficient to enable operation of a particular system. In one embodiment, the module comprises a plurality of memory chips forming a base structure wherein the base structure has a plurality of lateral faces and an upper and lower face. The module also comprises a plurality of non-memory chips that are mounted to the base structure in a manner such that each non-memory chip extends across at least a portion of the respective lateral face of the base structure. Preferably, the outer surface of each exterior chip is not in contact with other chips and is exposed for improved cooling. The non-memory chips may comprise processor chips, logic chips, and A to D converter chips. In another embodiment, the multichip module further comprises two additional non-memory chips that are positioned adjacent the upper and lower faces of the base structure. Preferably a plurality of conductive contacts are formed on the lateral faces of the base structure and a plurality of conductive elements are also formed on the first surface of the non-memory chips wherein the conductors are placed adjacent to the conductive elements to establish electrical connection between the memory chips and the non-memory chips.

In yet another aspect, the multichip module comprises a first plurality of chips having a first and a second side and at least one lateral edge wherein conductive elements are exposed on the at least one lateral edge of the first plurality of chips. Furthermore, the first plurality of chips are adhered together such that the at least one lateral edge of each of the plurality of chips define a lateral surface. The multichip module further includes a second chip having a first and a second surface wherein the first surface of the second chip is adhered to at least a portion of the lateral surface of the first plurality of chips wherein conductive elements are exposed on the first surface of the second chip. Furthermore, a conductive interconnect layer is interposed between the at least a portion of the lateral surface of the first plurality of chips and the first surface of the second plurality of chips. The conductive interconnect layer includes a pattern of conductive contacts that are connected to the conductive elements of the at least one lateral edge of the first plurality of chips and to the conductive elements on the first surface of the second chip so as to interconnect the conductive elements of the first plurality of chips to the conductive elements of the second chip.

Advantageously, the present invention provides densely packaged multichip structures that incorporates memory and non-memory chips in the same module. As such, chips of an entire system can be placed in the module so as to reduce the space occupied by the chips inside the system. Furthermore, the chips that generate high heat per unit area or require extensive interconnection with other chips in the module are positioned on the lateral faces of the base structure in a manner such that the outer surface of the chip is not in contact with other chips so as to permit improved cooling and more efficient wiring. These and other advantages of the present invention will become more fully apparent from the following description taken in conjunction with the accompanying drawings.

DETAILED DESCRIPTION OF THE PREFERRED EMBODIMENT

Figure 1:
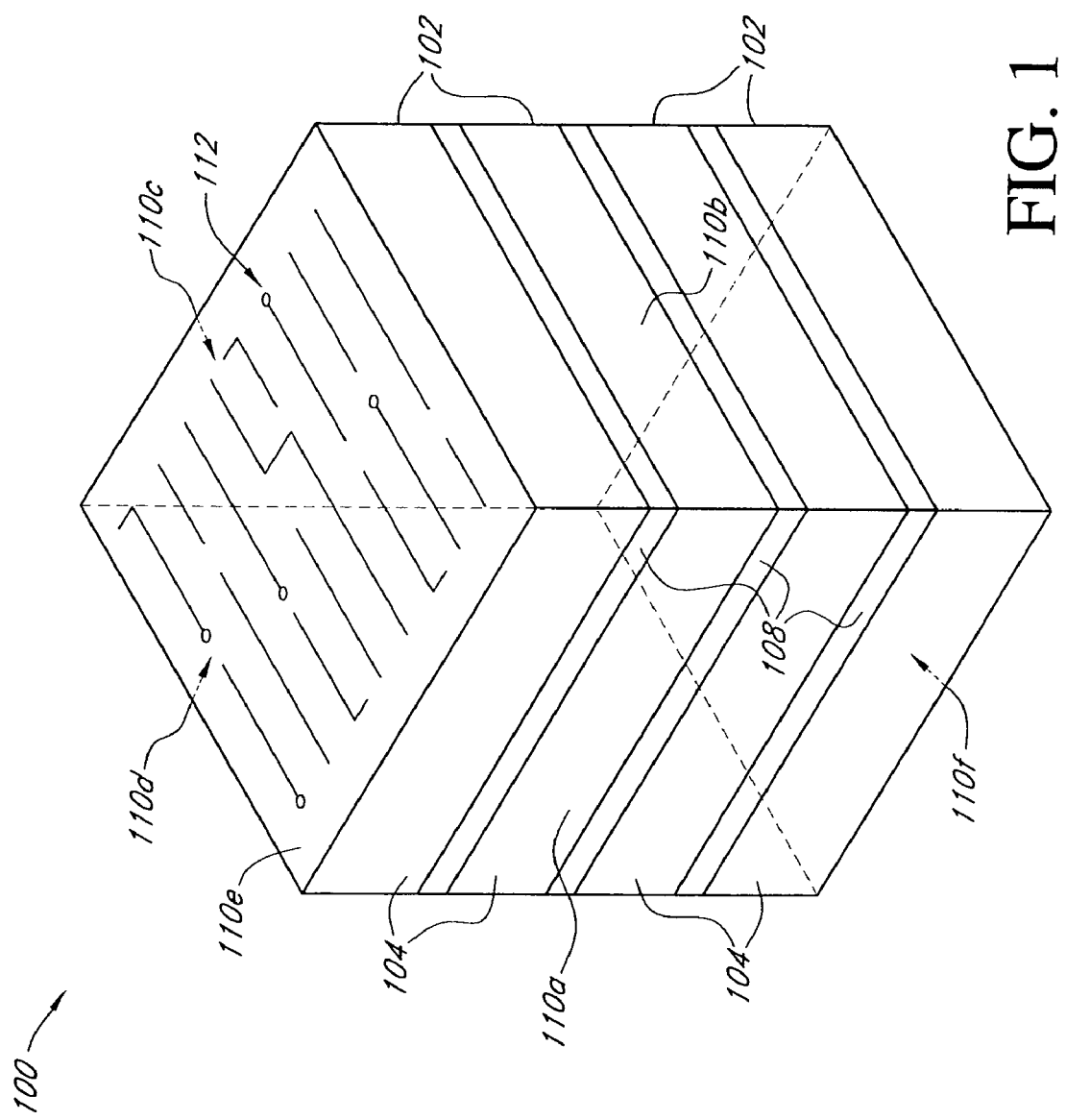
FIG. 1 illustrates a general perspective view of a base structure of a multichip module of the preferred embodiment.

References will now be made to the drawings wherein like numerals refer to like parts throughout. FIG. 1 provides a general perspective view of a base structure 100 of a multichip module of the preferred embodiment. As FIG. 1 shows, the base structure 100 comprises a plurality of integrated circuit chips 102 stacked and secured together in a known manner to form a three-dimensional rectangular structure. Each chip 102 comprises a semiconductor substrate 104 such as a silicon substrate, that carries a variety of integrated devices and circuitry formed using conventional semiconductor manufacturing processes. Furthermore, it is generally understood that each chip 102 in the stack has conductive leads that extend to one edge of the chip so as to provide electrical contact with external circuitry.

As shown in FIG. 1, the base structure 100 has four lateral faces 110*a, b, c, d* that are defined by the side surfaces of the chips 102. Preferably, the first lateral face 110*a* is substantially parallel to the third face 110*c* and perpendicular to the second and fourth face 110*b, d*. Preferably, the lateral faces 110*a, b, c, d* of the base structure 100 are substantially planar and dimensioned to mate with other IC chips in a manner to be described in greater detail below. The base structure 100 also has an upper face and a lower face 110*e, f* that are defined by the outer surfaces of the chips positioned at the upper and lower ends of the stack. In one embodiment, the upper and lower faces 110*e, f* of the structure 100 comprise exposed conductors 112. Preferably, the exposed conductors 112 are formed on an active surface of the chips located on the upper and lower ends of the structure 100. In one example, the chip on the upper end of the structure 100 can be stacked back to back against the adjacent chip in a manner such that the upper and lower faces 110e, f of the structure are formed by the active surface of the chips on the upper and lower ends of the structure 100. Alternatively, any two adjacent chips in the stack can be placed in a back to back configuration so that both the upper and lower faces 110e, f of the structure 100 are formed by the active surface of the chips at the ends of the stack. As will be described in greater detail below, the exposed conductors on the upper and lower faces of the stack permit easy interconnection with other exterior chips.

As FIG. 1 further shows, an insulating layer 108 is formed between adjacent chips 102 in the base structure 100 to provide insulation between adjacent chips and between the conductive leads extending from the chips. In one embodiment, the insulation layer 108 comprises a polyimide material and at least a portion of the polyimide material is converted to a foamed state in a manner described in detail in Applicant's co-pending patent application Ser. No. 09/382,524 filed Aug. 25, 1999, entitled "INSULATOR FOR HIGH DENSITY CIRCUITS" which is hereby incorporated by reference.

Furthermore, it is preferable that the chips 102 comprising the base structure 100 all perform essentially the same function and that the chips 102 do not require extensive electrical interconnection with other chips within the base structure 100. Furthermore, it is preferable that the chips 102 do not generate excessive heat during operation so that the chips 102 can be sandwiched in a stack with other chips without overheating. In one embodiment, the chips 102 in the base structure 100 are comprised of memory chips such as those used for DRAM, SRAM, or ROM circuits.

Figure 2:
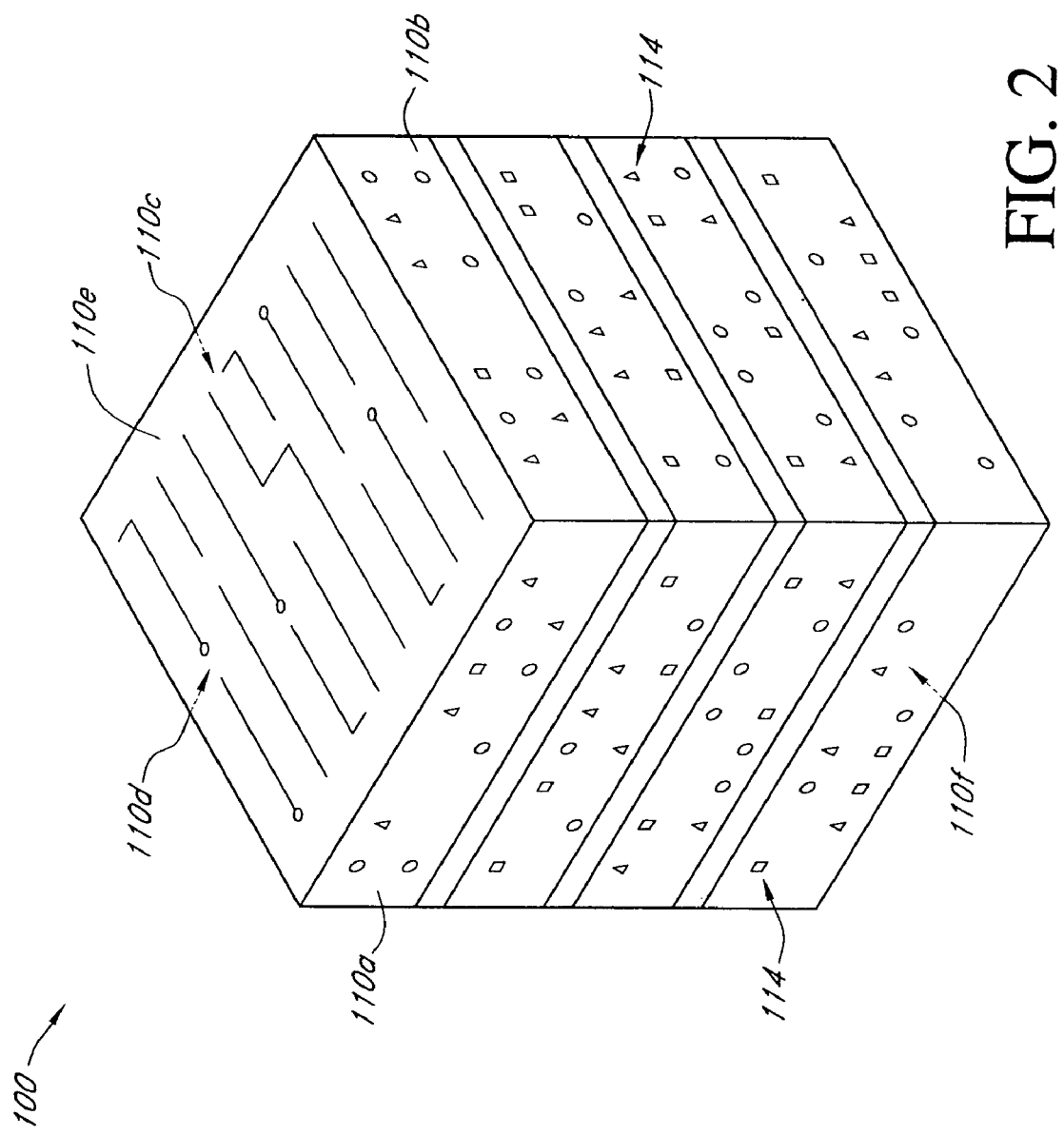
FIG. 2 illustrates the base structure of FIG. 1 having a plurality of conductors formed on the lateral faces of the base structure.

FIG. 2 shows that a plurality of conductive contacts 114 are subsequently exposed on the lateral faces 110a, b, c, d of the base structure 100 using methods known in the art. The conductive contacts 114 are configured to establish electrical connection between chips in the base structure 100 and exterior chips or external circuitry. In one embodiment, the method involves removing a thin layer of each lateral face 110 a, b, c, d using conventional etching, grinding, or lapping techniques to expose a portion of the conductive leads extending from the chips.

Furthermore, an insulating layer (not shown) may be formed on the upper and lower faces 110 e, f to provide insulation between the base structure 100 and subsequently mounted chips. Preferably, the insulating layer comprises a polymeric material such as polyimide that is approximately 0.7 microns thick and may also be applied to the upper and lower faces 110 e, f of the base structure 100 using a conventional photoresist spinning process. However, it can be appreciated that in addition to polyimides, other suitable polymers and their associated primers can also be used without departing from the scope of the present invention.

In another embodiment, at least a portion of each insulating layer is converted to a foamed state using methods described in U.S. Pat. No. 6,077,792 to Farrar, entitled "METHOD OF FORMING FOAMED POLYMERIC MATERIAL FOR AN INTEGRATED CIRCUIT" which is assigned to Micron Technologies, Inc. and hereby incorporated by reference in its entirety. In one embodiment, the foaming process includes exposing the insulating layer to a supercritical fluid such as carbon dioxide so as to form a plurality of voids and enclosed regions of air in the polymeric material. These voids or enclosed regions of air cause the insulating layer to increase in thickness and decrease in dielectric constant. In one embodiment, the thickness of the insulating layer is increased by a factor of three to about 2.1 microns while the dielectric constant is decreased to about 0.9.

Furthermore, the diameter of the voids or enclosed regions of air created in the insulating material is preferably less than the minimum width between adjacent conductors next to the insulating layer. Voids having diameters that are greater than the width between adjacent conductors may cause electrical shorting between the connections because there would not be any insulating material separating the connections at where the voids are located. In one embodiment, the average diameter of the voids is preferably less than 3 microns, more preferably less than 1 micron, more preferably approximately 0.1 micron.

Furthermore, a hydrophilic surface can also be formed on the foamed insulating layer. This is particularly applicable if the insulating layer comprises a hydrophobic material such as polynorbornene. In one embodiment, an upper surface of the foamed insulating layer is exposed to $CH_3$ and H. In particular, the $CH_3$ radicals react with the polymeric material to form a hydrophilic surface in a manner well known in the art. Preferably, methane gas is used as a source for the $CH_3$ and H radicals because of its relative stability.

Figure 3:
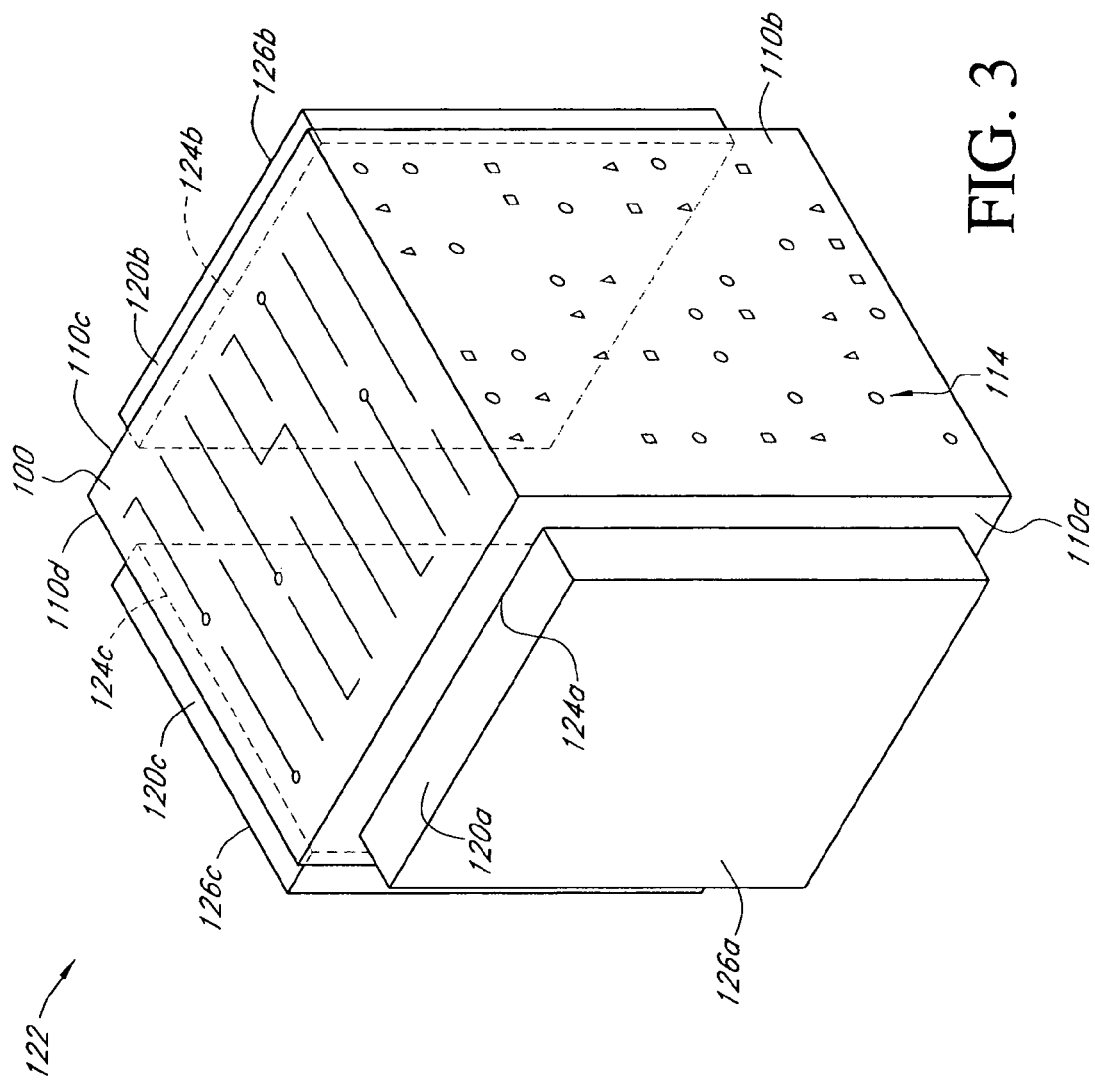
FIG. 3 illustrates the base structure of FIG. 1 having a plurality of exterior chips mounted to its lateral faces to form a multichip module of the preferred embodiment.

As shown in FIG. 3, after forming the conductive contacts 114 on the lateral faces 110a, b, c, d of the base structure 100, a plurality of exterior chips 120 a, b, c are mounted to three of the lateral faces 110 a, c, d of the base structure 100 to form a single compact module 122. As will be described in greater detail below, the fourth lateral face 110 b is intentionally left unoccupied so that it can later make contact with a substrate to establish electrical connection between the multichip module and external circuitry. The exterior chips 120 a, b, c can be secured to the lateral faces of the base structure 100 using epoxy or other suitable adhesives. Preferably, the exterior chips 120 a, b, c are positioned in a manner such that a first surface 124 a, b, c of each chip 120 a, b, c extends across at least a portion of the respective lateral face 110 a, c, d of the base structure 100 while a second surface 126 a, b, c of each chip 120 a, b, c remains exposed. Preferably, exposed conductive elements (not shown) are formed on the first surface 124 a, b, c of the exterior chips 120 a, b, c and are configured to make contact with the appropriate conductive contacts 114 on the lateral faces 110a, c, d of the base structure 100 so as to establish electrical connection between the exterior chips and the chips in the base structure. In some embodiments, the insulating material can also be formed between the lateral faces 110 a, b, c, d and the respective exterior chips positioned adjacent each lateral face.

Advantageously, the manner in which the exterior chips are mounted in the multichip module 122 leaves exposed the entire second surface 126a, b, c of the exterior chips 120a, b, c so that the chips can be cooled faster than those that are sandwiched in a stack. Thus, chips that require constant current flow, large power supply, or are otherwise likely to generate excessive heat during operation can now be incorporated in multichip modules as exterior chips. In one embodiment, the exterior chips may include non-memory chips such as processor chips, logic chips, and A to D converter chips. Furthermore, in multichip structures with only one exterior chip, it is preferable to mount the chip on the lateral face 110d that is the farthest from heat generating sources. For instance, in the embodiment shown in FIG. 3, such chip is preferably mounted on the second lateral face 110 c that is directly opposite from the fourth lateral face 100b because the fourth lateral face will be making electrical contacts with a substrate and thus be exposed to substantial heat.

Furthermore, the manner in which the exterior chips 126a, b, c are mounted to the base structure 100 also permits the exterior chips to make electrical contact with each of the chips in the base structure without extensive interconnection wiring. In particular, since the first surface 124 *a, b, c* of each exterior chip is positioned immediately adjacent the respective lateral face 110 *a, b, c* of the base structure 100, the exposed conductive elements on the first surface can establish electrical contact with the conductive contacts extending from the chips in the base structure without extensive conductive wiring. The reduced distance between chips is likely to also reduce the occurrence circuitry failures. If desired, the exterior chips on the lateral faces of the base structure can also make electrical contact with each other via wire bonding or other techniques known in the art. In one embodiment, the exterior chips are electrically connected to each other via edge C4 connections as shown and described in applicant's U.S. Patent No. 6,635,960, entitled "ANGLED INTERCONNECTS", which is hereby incorporated by reference in its entirety.

Figure 4:
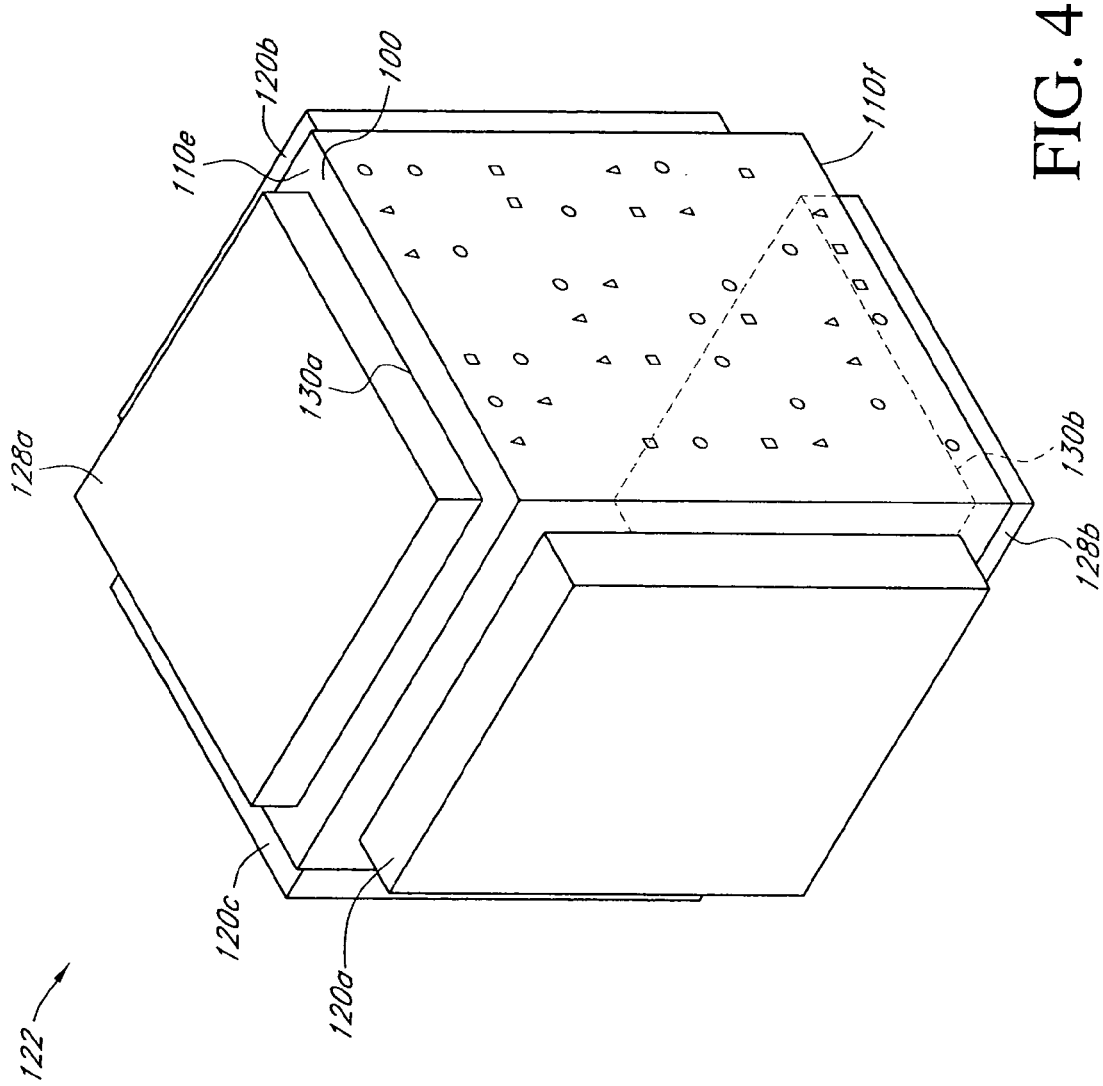
FIG. 4 illustrates the multichip module of FIG. 2 having additional chips mounted to the top and bottom faces of the base structure.

FIG. 4 shows another embodiment of the multichip module 122 in which two additional exterior chips 128*a*, 128*b* are mounted to the upper and lower faces 110*e*, 110*f* of the base structure 100. Preferably, the chips 128*a*, 128*b* are mounted in a manner such that a first surface 130*a*, 130*b* of each chip 128*a*, 128*b* containing exposed conductive elements is placed adjacent the upper and lower faces 110*e*, 110*f* the base structure 100 containing exposed circuitry. The chips 128*a*, 128*b* can be electrically connected to other chips within the base structure 100 via metallized trenches or edge connection as disclosed in Applicant's U.S. Patent No. 6,635,960 entitled "ANGLED INTERCONNECTS".

Advantageously, as shown in FIG. 4, the multichip module 122 allows at least five exterior chips to be mounted to the base structure in a manner such that a substantial surface area of each exterior chip is not in close contact with another chip and remains exposed to air circulation and cooling. When at least five exterior chips are to be used, it is desirable that, in constructing the base structure 100, the active, circuitry-containing surface of these chips be exposed on the outer faces 110*e*, *f*, of the structure 100. This can be accomplished by placing two chips back to back in the stack as discussed above. The module can incorporate both memory chips and non-memory chips that generate high heat per unit area during operation. As such, chips for an entire systems can be packaged into a single compact module, thereby significantly reducing the amount of space needed to accommodate the chips inside the system. Furthermore, the multichip module can be conveniently plugged into a computer, machine, or other instrument as a single unit, which saves time in making repairs or replacing components.

Figure 5:
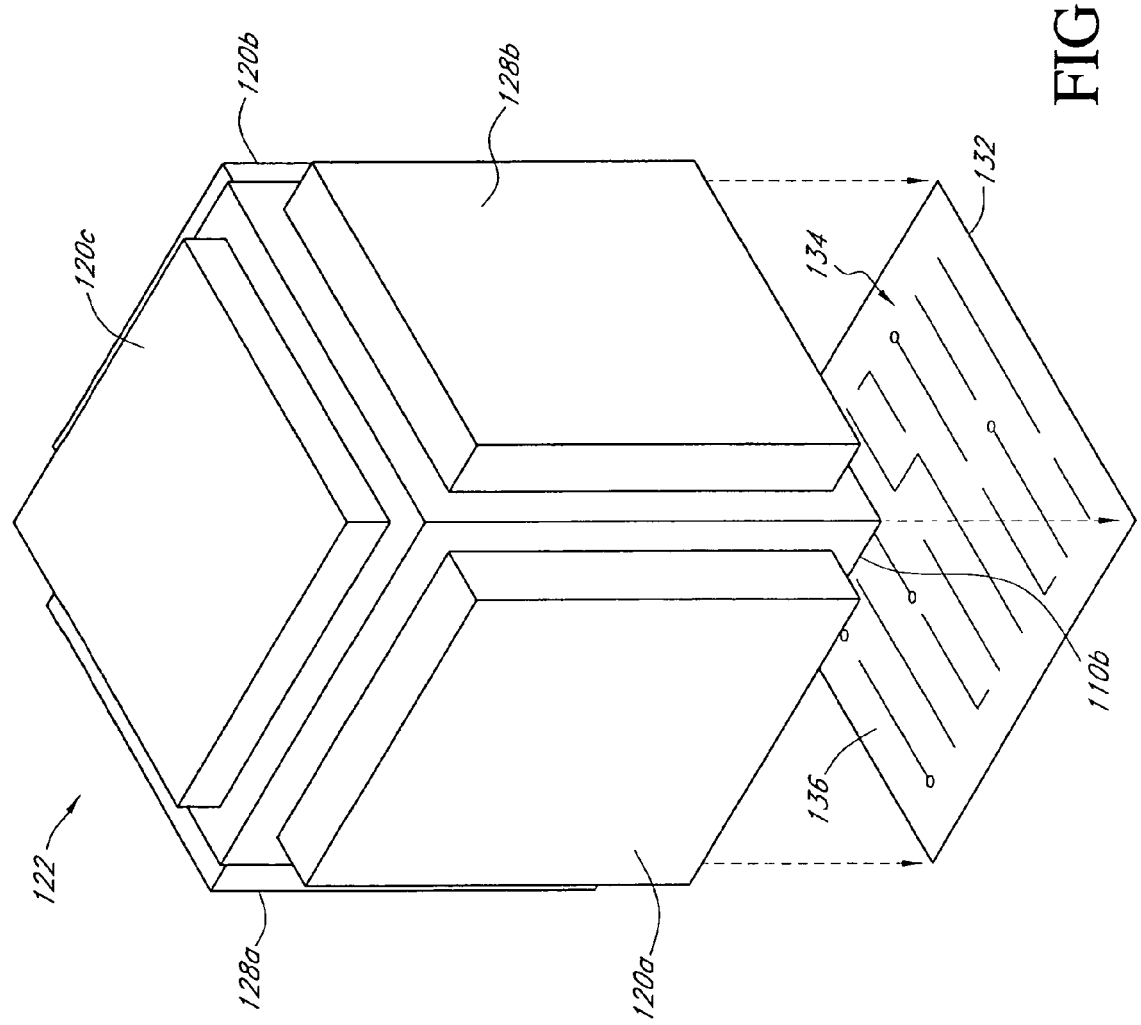
FIG. 5 is a schematic illustration of the multichip module of FIG. 4 ready to be mounted to a substrate to establish electrical connection with external circuitry.

FIG. 5 schematically illustrates that the multichip module 122 can be mounted to a substrate 132 to establish contact with external circuitry. Preferably, a metallized pattern 134 is formed on an upper surface 136 of the substrate 132 to make contact with the conductors formed on the fourth lateral face 110*b* of the base structure 100. Furthermore, the exterior chips can establish electrical contact with the metallized pattern 134 on the substrate 132 via wire bonding. As previously described, the multichip module 122 can comprise IC chips of an entire system including processor, logic, and A to D converter chips that are typically not included in most conventional multichip modules because of overheating and chip interconnection problems. The multichip module 122 of the preferred embodiment allows chips that are susceptible to overheating to be secured to the exterior faces of the base structure so that a large surface area of the chip is not in contact with another chip so as to allow more rapid heat dissipation. Moreover, the multichip module provides a shorter distance between conductive elements on the exterior chips and those extending from the chips in the base structure so that connections between the exterior chips and all other chips in the module can be established without extensive interconnection wiring. Thus, IC chips of an entire system can be packaged in a single multichip module in a convenient and cost-efficient manner.

Although the foregoing description of the preferred embodiment the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention. Consequently the scope of the invention should not be limited to the foregoing discussions, but should be defined by the appended claims.

What is claimed is:

1. A method of forming a multichip module, comprising:

securing together a plurality of semiconductor chips in a manner so as to form a base structure having an upper exterior surface, a lower exterior surface, and a lateral exterior surface, said lateral exterior surface is comprised of a portion of each chip, wherein an insulating material is formed on the upper exterior surface and interposed between at least two adjacent chips in the base structure, wherein said insulating material comprises a polymeric material;

forming a plurality of conductive contacts on the lateral exterior surface wherein the conductive contacts provide connection between the chips and external circuitry;

converting at least a portion of the insulating material formed on the upper exterior surface and between two adjacent chips in the base structure to a foamed state; and securing an exterior chip to the lateral exterior surface wherein a first surface of the exterior chip is positioned adjacent the lateral exterior surface and extends across at least a portion of the lateral exterior surface.

2. The method of claim 1 wherein forming a base structure comprises positioning the chips in a manner such that a circuit-containing, active surface of one of the chips is positioned at an upper end of the structure, wherein the circuit-containing, active surface of the chip forms the upper exterior surface of the structure.

3. The method of claim 1 wherein the exterior chip has a second surface that is substantially parallel to the first surface, wherein the second surface is exposed to air cooling.

4. The method of claim 1 wherein securing the exterior chip to the lateral face comprises using an adhesive.

5. The method of claim 1 further comprising securing exterior chips to the upper and lower exterior surfaces of the base structure.

6. The method of claim 1 further comprising forming a plurality of conductive elements on the first surface of the exterior chip wherein the conductive elements are configured to make contact with conductive contacts formed on the lateral exterior surface of the base structure.

7. The method of claim 1, wherein converting at least a portion of the insulating material to a foamed state comprises exposing the insulating material to a supercritical fluid.

8. The method of claim 1, wherein converting at least a portion of the insulating material to a foamed state comprises forming a plurality of voids in the insulating material.

9. The method of claim 1, further comprising forming a hydrophilic surface on the insulating material after converting the insulating material to a foamed state.

10. A method of forming a multichip module, comprising:

stacking together a plurality of semiconductor chips in a manner so as to form a base structure having an upper exterior face, and a lateral face that is comprised of a portion of each chip;

forming an insulating material on the upper exterior face and between at least two adjacent semiconductor chips in the base structure, wherein said insulating material comprises a polymeric material;

converting at least a portion of the insulating material to a foamed state; and mounting an exterior chip to the base structure in a manner such that a face of the exterior chip extends in a plane that is substantially parallel to the lateral face of the base structure; and electrically connecting the exterior chip to at least one chip in the base structure.

11. The method of claim 10, wherein said base structure comprises a cube structure.

12. The method of claim 10, wherein the exterior chip is secured to the lateral face of the base structure using an adhesive.

13. The method of claim 10, wherein the base structure has a second lateral face that is comprised of a portion of each chip.

14. The method of claim 13, further comprising mounting a second exterior chip to the base structure in a manner such that a face of the second exterior chip extends in a plane that is substantially parallel to the second lateral face of the base structure.

15. The method of claim 10, further comprising forming a plurality of conductive contacts on the lateral face wherein the conductive contacts provide connection between at least one of the chips and external circuitry.

* * * * *

UNITED STATES PATENT AND TRADEMARK OFFICE
CERTIFICATE OF CORRECTION

PATENT NO. : 7,465,608 B1  Page 1 of 1
APPLICATION NO. : 10/920022
DATED : December 16, 2008
INVENTOR(S) : Farrar It is certified that error appears in the above-identified patent and that said Letters Patent is hereby corrected as shown below:

On the title page, item (63), under "Related U.S. Application Data", in column 1, line 2, after "6,790,702" delete "." and insert -- , which is a division of application No. 09/932,859, filed on Aug. 17, 2001, now Pat. No. 6,433,413. --, therefor.

In column 1, line 9-10, delete "claims priority to U.S. Pat. No. 6,433,413 filed Aug. 17, 2001," and insert -- is a divisional of U.S. application Ser. No. 09/932,859, filed on Aug. 17, 2001, now U.S. Pat. No. 6,433,413, --, therefor.

Signed and Sealed this

Twenty-fourth Day of March, 2009

JOHN DOLL
*Acting Director of the United States Patent and Trademark Office*